United States Patent [19]
Hill, Sr.

[11] 4,148,580
[45] Apr. 10, 1979

[54] PROCESS FOR MAKING SHADE RELIEF MAPS AND THE MAP MADE THEREBY

[76] Inventor: Everette B. Hill, Sr., 1007 W. College Dr., High Point, N.C. 27262

[21] Appl. No.: 754,607

[22] Filed: Dec. 27, 1976

[51] Int. Cl.$^2$ .................. G03B 27/68; G03B 27/32; G09B 29/12
[52] U.S. Cl. .......................... 355/52; 35/41; 355/77
[58] Field of Search ............... 35/40, 41; 355/71, 77, 355/52

[56] References Cited
U.S. PATENT DOCUMENTS

| | | | |
|---|---|---|---|
| 2,430,277 | 11/1947 | Cooke | 35/41 |
| 2,503,126 | 4/1950 | Muldrow et al. | 35/40 |
| 3,280,696 | 10/1966 | Ketchian | 355/52 |
| 3,692,406 | 9/1972 | Blachut et al. | 355/52 X |
| 3,743,415 | 7/1973 | Gilman | 355/52 |
| 4,029,410 | 6/1977 | Richter | 355/52 |

Primary Examiner—Donald A. Griffin
Attorney, Agent, or Firm—Hugh C. Bennett, Jr.

[57] ABSTRACT

A method for making shade relief maps with the value of the shade thereon proportional to the degree of actual ground slope, to provide, thereby, the simulation of a third dimension to two dimensional map productions. A discrete weight and configuration study of the slope in an area to be shown in shade relief is converted by mechanical means to an image production in known scale of surface undulations having shade density values proportional to the degree of slope. The shade image production is superimposed in scale registry upon an image containing features other than slope thereby providing, through the combined image, a shade relief map production having slope related shade thereon. The product of the aforesaid method comprises a map having manufactured shade provided thereon wherein the value of such shade is proportional to the degree of ground slope.

6 Claims, 11 Drawing Figures

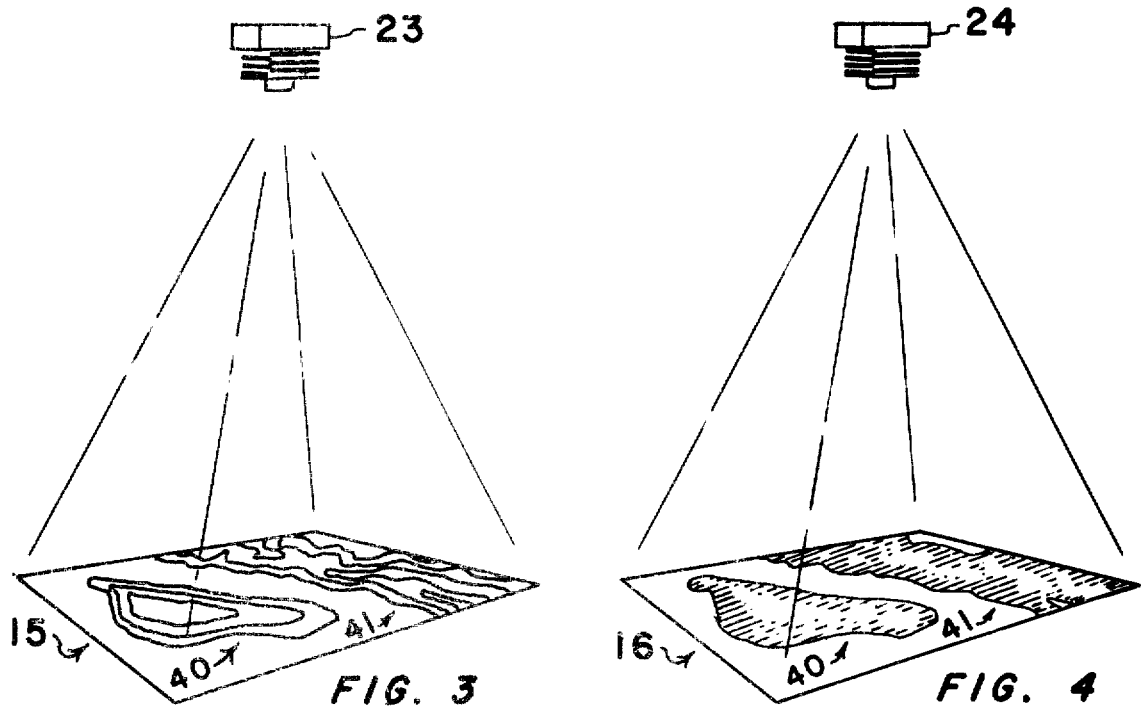
FIG. 3
FIG. 4
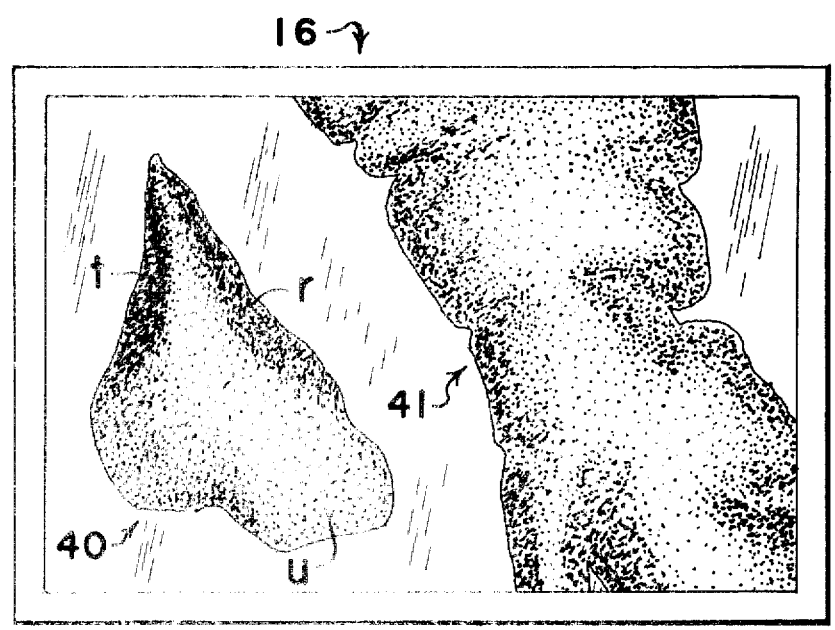
FIG. 5

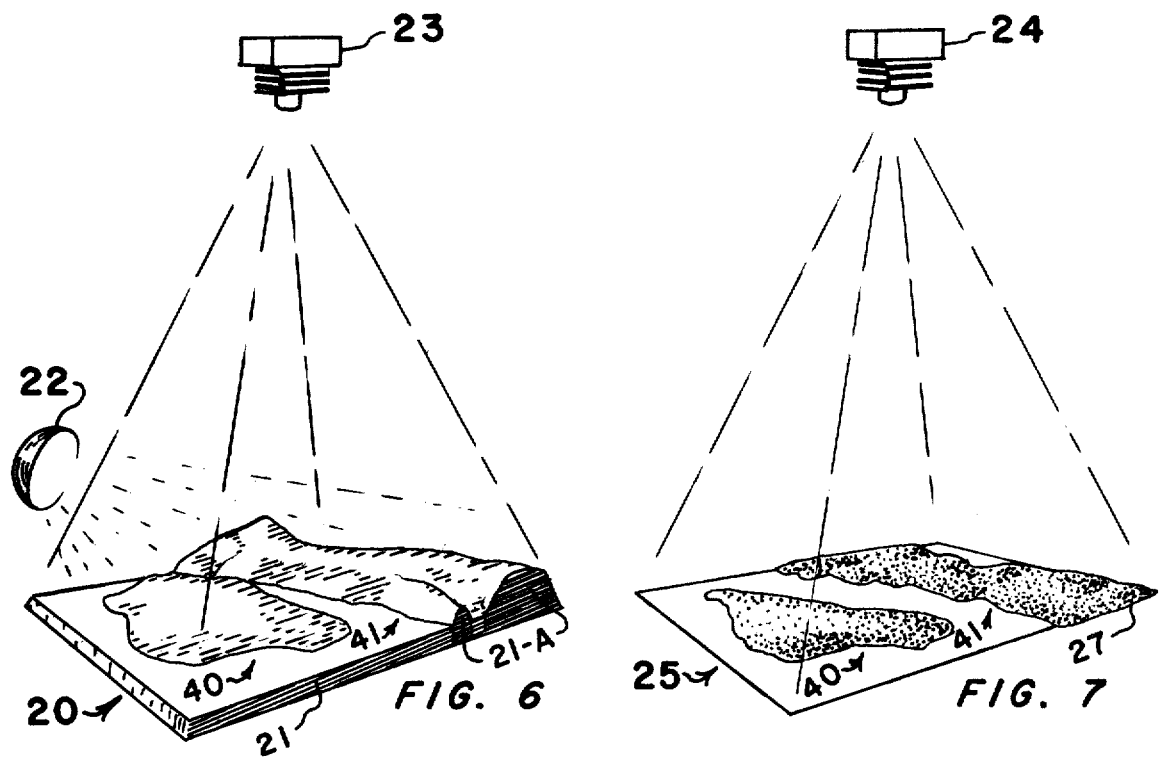
FIG. 6
FIG. 7
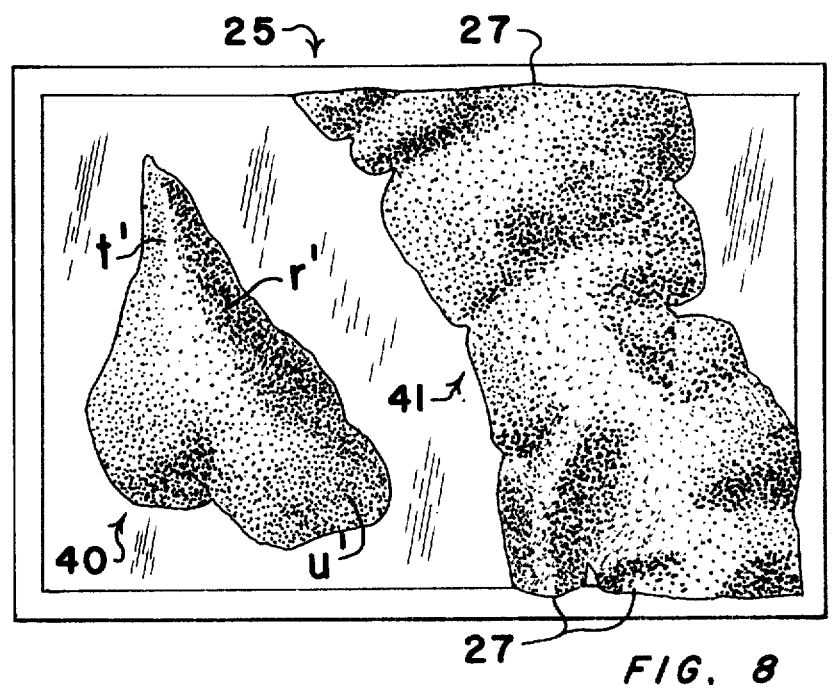
FIG. 8

PROCESS FOR MAKING SHADE RELIEF MAPS AND THE MAP MADE THEREBY

BACKGROUND OF THE INVENTION

The invention disclosed herein pertains to the field of map making and more particularly to a method for the representation of relief on a conventional two dimensional map to provide thereon the simulation of a third dimension and to the map produced thereby. Most features are readily shown on maps either by drawing them to scale, or arbitrarily out of scale, and by the use of conventional map maker symbols or other such means; however, the showing of relief, such as by shade to reflect slope, offers a peculiar problem because it involves the third dimension, that is the dimension of depth in addition to those of length and breadth.

One of the earliest and most simple methods developed in the art of map making to represent relief on maps is the process of determining the altitude and location of a particular point and marking it on the map. While spot marking alone fails to give any general idea of relief, it is helpful in revealing the height of hill summits or points along a road. A more complex method contemplates the use of contours, whereby lines having a constant height above sea-level or a known reference point are used as a means of showing relief. Both spot marking and contours provide an exact method of representing relief on a map; however, neither illustrate visually the effect of elevations and depressions to provide the map with the simulation of depth.

While methods have been developed in the prior art to pictorially represent relief on a map, primarily in some form of shade relief, each, however, has heretofore failed to provide a shade relief map sufficiently simple and inexpensive in manufacture to enable distribution thereof on a wide scale, yet a map having sufficiently accurate representation of relief thereon so that such representations might be useful for purposes other than mere decoration and/or ornamentation.

One method, long known in the art, for pictorial representation of relief makes use of shade to bring out the relief on a map. The shading, or stippling as it is sometimes called, is executed manually with a stubby brush, with the purpose of bringing out relief as it would be seen on a three-dimensional relief model lighted from above. The flat parts appear light and the slopes rather darker. While a shade relief map produced by stippling is similar to the map made by the novel method of this invention, disadvantages of the known method reside in the fact that it is manually executed, thereby lacking in the accuracy and exactness of the present invention, and, moreover, represents considerable commitment of time and money in obtaining the requisite artisan skills to visually and manually convert relief data into a shade-type pictoral representation of relief useful in map production.

Finally, a shadow effect for representing relief is attained by stippling a map to represent relief as it would appear if the area were lighted from the north-west corner. This effect, which is, perhaps, the most common process for making relief maps, is also accomplished by the construction of a three-dimensional model from plaster of Paris or the like, then photographing the model with oblique lighting whereby shadows are cast to provide the effect of an aerial photograph wherein the shadows are projected toward the observer. See, for example, U.S. Pat. No. 3,078,598. The effect of this method is not always sound. First, because an escarpment facing the north-west is not brought out at all, while the one facing the south-east is seen by the representation of shadow. Finally, upon viewing a map having shadow related relief without properly orientating it to the viewer, distortions in the form opposite those intended result. For example, a railroad fill instead appears as a cut, rivers and streams will appear to run along the tops of hills and ridges, rather than along valleys and cuts.

Accordingly, the whole difficulty of showing relief by a uniform method which would render comparison of areas easy resides in the fact that one method ideal for a region of high relief is unsuited to a region of low relief. Therefore, for the representation of all types of topography in the production of maps in a national survey, some sort of compromise has heretofore been necessary in the selection of a single known method or combination thereof.

SUMMARY OF THE INVENTION

The present invention encompasses a method by which an improved relief map is manufactured, having representations of relief thereon which relief is a manufactured shade where the value of the shade is proportional to the degree of actual slope appearing in the ground area represented; which relief provides an added dimension to a conventional two-dimensional map production by providing the simulation of a third dimension; which method is simple and inexpensive, using only skills of the trade and lower craft level, rather than those of the higher craft and artisan level presently required for the production of similar maps; which relief provides an accurate and exact representation of the actual degree of slope when viewed from any vantage point without the optical and shadow distortions occurring with present shade relief maps; which method provides a truer graphic representation of all types of topography in the production of maps.

According to the present invention an improved slope related shade relief map is manufactured by first providing a discrete weight and configuration study of the slope or relief in an area to be illustrated. The study may consist of a manually prepared tracing of the contour lines from a U.S. Geological Survey topographic map, which study is mechanically converted, as by photographic diffusion, to shade density values proportional to the degree of slope and provided in form for use in image production. Data pertaining to physical features and the like are provided also in form for use in image production and the two images are combined in superimposed registry. Copies of the combined image are then reproduced for use in shade relief map production. The map manufactured in accordance with the aforesaid method has slope related shade thereon to provide a shade relief map with an accuracy, exactness appearance heretofore unknown in map production of the type contemplated.

The accompanying drawings, forming a part of this specification, are provided in order that the invention may be more readily understood and to illustrate by way of example the steps of a preferred process and the product made therefrom.

In the drawings:

FIG. 3 is a perspective view explaining the process of this invention of taking a plane photograph of the contour tracing of FIG. 1;

FIG. 4 is a perspective view explaining the process of this invention wherein the image obtained from the step illustrated in FIG. 3 is projected and diffused to obtain an image with manufactured shade, with the value of the shade proportional to the degree of slope;

FIG. 5 is a plan view of the same subject as that illustrated in FIGS. 1, 3 and 4 after a further stage of processing;

FIG. 6 is a perspective view explaining the prior art process of taking a plane photograph of the three-dimensional model of FIG. 2, with oblique lighting to cast shadows and, thereby, bring out the relief;

FIG. 7 is a perspective view explaining the prior art process wherein the image obtained from the step illustrated in FIG. 6 is projected in a sharp line projection to obtain a shadow related relief production;

FIG. 8 is a plan view of the same subject as that illustrated in FIGS. 2, 6 and 7 after a further state of processing;

Figure 9:
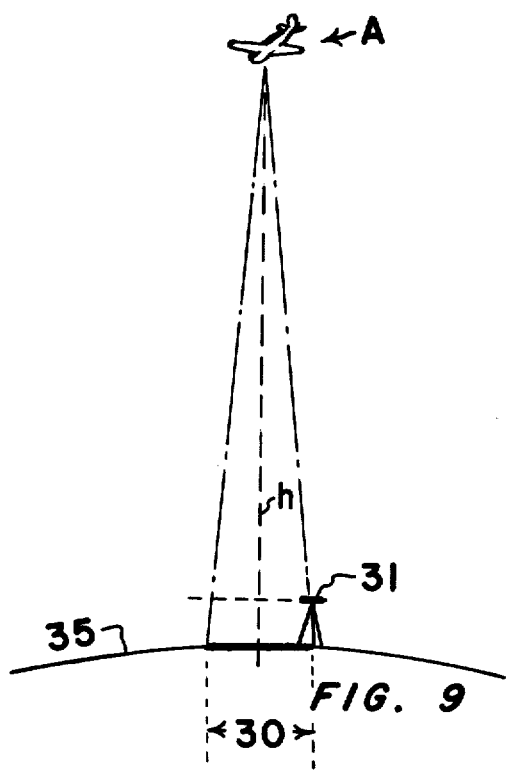
FIG. 9 is a representation of an aerial and field survey system that produces data related to horizontal and perpendicular dimensions of a finite area about each point of interest.

FIG. 9 and the following discussion thereof is included to establish a common ground that will be helpful to an understanding of the invention hereinafter disclosed. The aerial and field survey system represented in FIG. 9 is commonly employed in mapping for the collection of data related to horizontal and perpendicular dimensions in an area of study. The data collection process, as pertaining to the field of photogrammetry, encompasses a process whereby pairs of photographs are taken some distance apart but in parallel direction and studied sterioscopically. By this arrangement, the pair of two-dimensional photographs come to life as a single three-dimensional model, aiding in the recognition of, among other things, relative heights. By instrumentation vertical and horizontal measurements can be made on these photographic three-dimensional models, thereby providing a means by which scopographical maps having contour intervals thereon are made. An end result of the process is a topographic map such as the Philpott Reservoir Quadrangle, Virginia, 7.5 Minutes Series (topographic) Map, which is the primary source of data for both the preferred example disclosed herein and the prior art method described for comparison therewith.

The airplane A takes vertical photographs, normally in parallel pairs, to provide stereoscopic overlaps of an area of study 30 of the earth's surface 35. While the overflights and photographing are intended to take place at a fixed altitude h with the optical axis maintained at true vertical, distortion does occur by variation of the plane's altitude and by tilt of the camera. Further distortion appearing in aerial photographs resides from the fact that all points not at the same elevation and not in line with the optical axis (assumed to be vertical) will have a relative displacement on the photograph. This is known as relief displacement. Such distortions are reduced in part or eliminated by means of ground survey with survey instruments 31 to establish the true elevation of reference points whereby contour plotting from the photograph to a map is possible.

At times it is desirable to create the effect of a third dimension on a two-dimensional map to illustrate thereon the existence of relief as appearing in the area of study. The observer will, thereby, comprehend more readily land features and characteristics as they actually exist. The procedure heretofore used in preparation of such relief maps is illustrated by FIGS. 2, 6, 7, 8 and 11.

Figure 2:
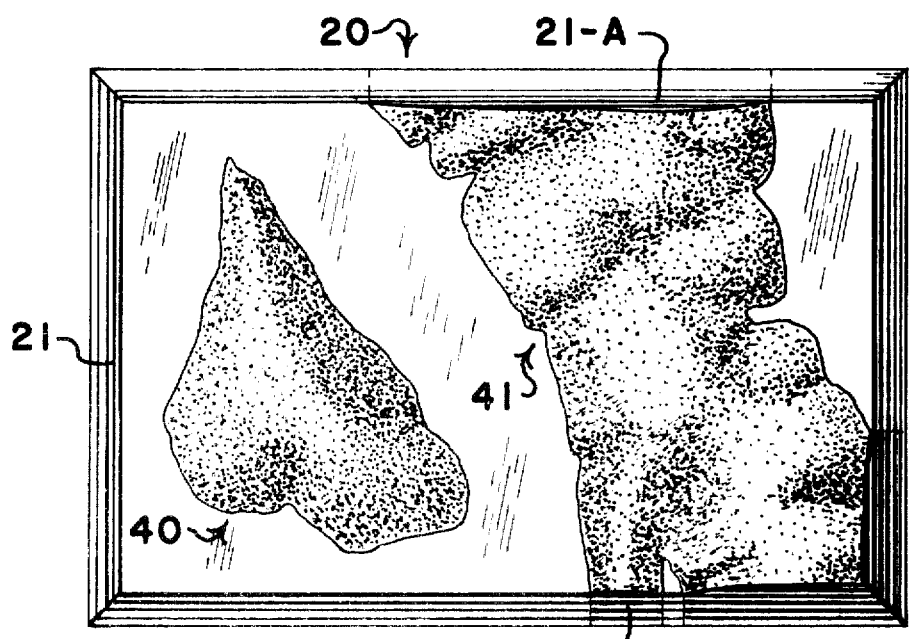
FIG. 2 is a plan view of a three-dimensional relief model, hand made by known methods using the same data source from which the contour study in FIG. 1 was obtained.

Turning now to FIG. 2, the three-dimensional model 20 illustrated therein was hand made from a contour study prepared from the Philpott Reservoir Quadrangle Map heretofore mentioned. The area of study illustrated in FIG. 2, which area is used throughout in the examples described herein, is a portion of the Philpott Reservoir known as Turkey Island and is the inverted heart-shaped island 40 appearing in the left portion of FIG. 2. Also appearing in the area of study is a portion of Deer Island, which is the elongated land mass 41 appearing in the right portion of FIG. 2. The model illustrated in FIG. 2 was manually constructed with plaster of Paris using procedures well known in the art and requiring a total of 222 man-hours of higher craftsman and artisan skills.

When completed, the model dimensions were 32 inches by 23 inches and the height varied from ¼ inch to 3 inches. It is supported on a 5/8-inch plywood base, not shown, and has a dry weight of approximately 25 to 50 pounds. A beveled edge 21 is frequently provided if the model is to be used for purposes of making three-dimensional relief maps. Accordingly, aside from the expense incurred in the production thereof, problems occuring in cataloging, storage and handling models of this type can readily be appreciated.

Following construction of the three-dimensional plaster of Paris model 20, it is next sprayed with a coat of light gray paint to reduce light reflections to shaded portions thereof. Finally, side lighting is provided by a screen photoflood bulb 22 placed at an angle and direction to produce a source of light from the upper left-hand corner of the model 20, and photoprints, as illustrated in FIG. 6, are made using a camera 23 set in a position perpendicular thereto and centered thereover.

The photograph produced from the step illustrated in FIG. 6 is next projected by the projector 24 as a sharp image on a plane surface as illustrated in FIG. 7 to obtain therefrom a shadow-related relief image production 25. This image production, in turn, is combined with a second, sharp line image production, not shown, containing physical features such as roads, landmarks and the like, to produce a completed relief map presenting the effect of depth by inclusion of shadow produced shade thereon. The problem of relief displacement, discussed in connection with the aerial survey system represented in FIG. 9, is encountered also when photographing the model 20, FIG. 6, thereby causing distortions, illustrated in part at 27 in FIG. 7 and 8, which distortions are more obvious when the model image production 25 is combined with the plain image production due to improper registry.

Figure 11:
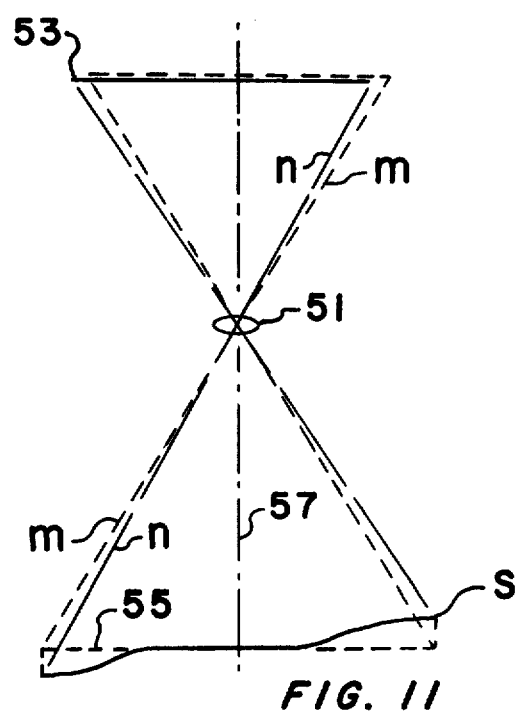
FIG. 11 is a diagram further explaining the process as illustrated by FIG. 6, showing the distortion resulting from projection of a three-dimensional surface by lens to an image plane.

FIG. 11 illustrates this problem diagrammatically whereby the top plan view of a three-dimensional surface, represented by the heavy line S, is projected by a lens 51 to an image plane 53. The areas above and below the horizontal surface represented by the dashed line 55, and not in line with the optical axis 57, tend to be shifted away from or toward the axis 57, as illustrated by the broken line n and dashed line m. The distortions resulting therefrom are compounded when the second image, normally obtained from a two-dimensional map source, such as the Philpott Reservoir Map, containing physical features and the like, is combined with the shadow-related relief image production 25. The physical features, oftentimes, are not in true registry with the shadow produced shade and, thereby, causes the map to lose the effect attempted to be gained by inclusion of the shade.

Figure 1:
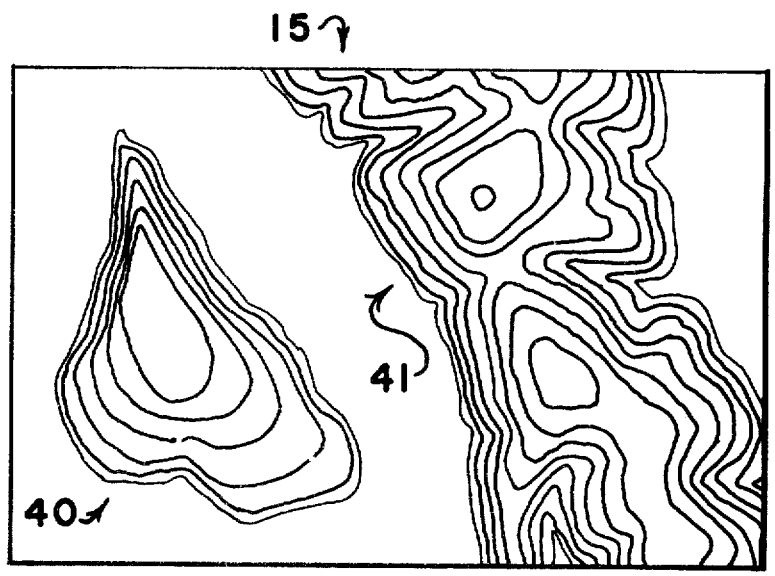
FIG. 1 is a plan view of a tracing of the contour lines from a U.S. Geological Survey topological map covering an area which is desired to be shown in relief.

Having in mind the prior art method for producing a shade relief type map described hereinabove and the disadvantages attendant thereto, a preferred method of the present invention referring to FIGS. 1, 3, 4 and 5 will now be described. A contour sharp line drawing 15, FIG. 1, is prepared by manually tracing a photo enlargement of the area of study taken from the Philpott Reservoir Quadrangle Map previously mentioned. In the example, 8 semi-skilled manhours were used to prepare the contour study, representing a substantial reduction in skill level and time involved, as compared to that required to construct the three-dimensional model 20 illustrated in FIG. 2. Moreover, preparation of a contour study of the type in FIG. 1 is generally the beginning step toward development of the three-dimensional model 20. The present invention, however, eliminates the need for a model by recognizing that the line or point weight and proximity established in the contour study 15 establishes a value which can be converted to a slope-related shade study which conversion can be accomplished by, but not limited to, photo mechanical means.

Most first generation contour drawings, that is those made from field survey in the matter discussed in connection with FIG. 9, can be used to obtain satisfactory contour studies to produce shade relief in accordance with the method of this invention. Generally, such first generation contour drawings are prepared with selected contour lines, every fifth line for example, widened and labeled for reference emphasis. In normal applications, this would present no appreciable obstacle in conversion of such contours to shade process. In critical applications, however, involving vast increases in scale or for production of more delicate shade in low gradient situations, a contour drawing consisting of evenly weighted lines may be required. In even more extreme cases, intermediate lines can be drawn by approximation of intervals between the established contours.

No drawing consisting only of contour lines or points covering the area of study selected in the Philpott Reservoir was readily available for use in the preferred example; therefore, the contour study 15 was made in the manner described previously. This contour study produced a uniform heavier line weight which allows a greater range of diffusion latitude without excessive drop in shade contrast between the different levels of relief.

The next step in the preferred example is to convert the discrete line weight and configuration values obtained by the contour study 15 to shade density values proportional to the degree of slope for use in image production. This step is illustrated in FIGS. 3 and 4.

First, in FIG. 3, the contour study 15 is photographed by a camera 23 positioned perpendicularly thereover and centered thereabove. Next, the sharp line photographic image is projected by the projector 24 onto a plane surface, FIG. 4; however, the image is selectively distorted to produce an indiscrete shade configuration wherein said shade is proportional to the degree of slope. Selective distortion of the sharp line photographic image to produce shade values from a line or point density study is easily accomplished by, without limitation thereto, use of diffusers such as soft focus lens, diffusion grating or the like, or manipulation by physical means such as focus shift or chemical means such as photo-development variation.

In the preferred example, the method employed was that of focus shift, which is most easily observed and evaluated during the setup for exposure of the shade relief production. By proportionally shifting the focal distance of both the object and the image, the scale thereof may be controlled and adjusted to correspond with the sharp focus scale of a line drawing containing physical features and the like of the subject area for use in completing the finished map.

Figure 10:
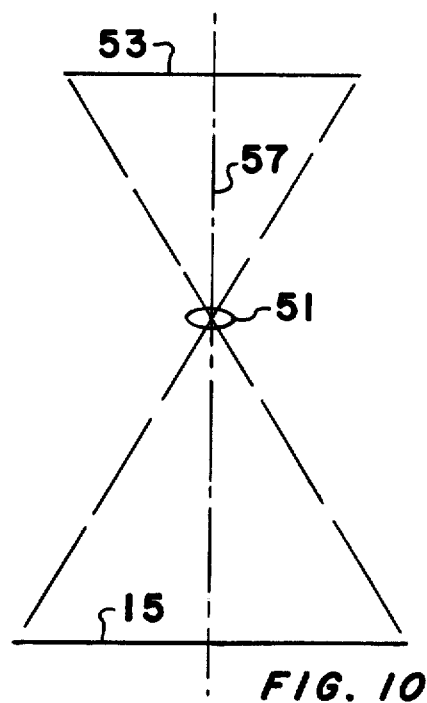
FIG. 10 is a diagram further explaining the process as illustrated by FIG. 3, wherein the contour lines are projected by lens to an image plane without distortion.

Accordingly, it can now be appreciated that by photographing the contour study as a plane surface, relief displacement inherent in the process utilizing the three-dimensional model is eliminated. See FIG. 10, wherein the contour sharp line drawing 15 is projected by the lens 51 to an image plane 53 without distortion.

Also, a comparison of the shade effect achieved by use of the slope related shade method of this invention with that achieved by photographing the shadow produced shade from the three-dimensional model illustrates the increased accuracy and exactness of the product of those known in the prior art. FIGS. 5 and 8 illustrate this by comparison, wherein the slope t on the northwest side of Turkey Island is illustrated accurately in FIG. 5 with heavy shading indicating the steepness thereof relative to the lower gradient slope r on the northeastern side and the substantially flat area u on the southern end thereof. In FIG. 8, however, the slope t' shows light because it is relatively perpendicular to the light source, while the slope r', being obscured from the light shows darker shade by the shadow case thereon. The southeastern portion u' of Turkey Island being, as stated, relatively flat in slope shows dark because of the shadow case thereon from the steeper northwest ridge of the island.

A further distortion inherent in the prior art process occurs by rotation of the map production until the light source appears to be coming from a direction other than the upper left hand corner. This change of orientation will reverse the effect of elevations and depressions so that ridge lines appear to become depressions and valleys appear to become ridges, thereby giving the illusion of rivers and streams running along the top of ridge lines rather than along the courses of valleys and cuts as they naturally do.

It is understood that the above-described process is simply illustrative of the many possible specific applications of the invention. For example, while the invention is referred to in the specific context of manually constructing a contour study of a specific ground area and, through photographic means, converting the discrete line weight and configuration of the contour study to shade density values for combination in registry with a sharp line drawing of physical features and the like to create therefrom a shade relief map having slope related shade thereon, the process may equally well be used through any means of converting discrete line or point weight and configurations to shade density values for use in image production to create maps having slope related shade. Numerous and varied modifications may be made by one skilled in the art without departing from the spirit and scope of the invention.

What is claimed is:

1. A method for manufacturing a slope related shade relief map having shade values thereon proportional to the degree of slope, said method comprising the steps of: providing a discrete weight and configuration study having values proportional to the degree of actual slope appearing in the area represented; converting the discrete weight and configuration values by selective distortion thereof to produce an indiscrete shade configuration for use in image production, said indiscrete shade configuration having shade density values proportional to the degree of slope in said area; providing a study of selected features in said area other than slope, for use in image production; combining the proportional shade density value image and features image in superimposed registry; and reproducing the combined image to produce a slope related shade relief map having representations of relief thereon, said relief comprising a manufactured shade with the value thereof proportional to the degree of actual slope appearing in the area represented.

2. The method in accordance with claim 1 wherein: said discrete weight and configuration study is a manually drawn contour tracing at a known scale.

3. The method in accordance with claim 1 wherein: conversion of the discrete weight and configuration study is accomplished by photographic diffusion.

4. The method in accordance with claim 1 wherein: conversion of the discrete weight and configuration study is accomplished photographically by proportional shifting of the object and image focal distances to keep the print size at a predetermined focus scale.

5. A shade relief map having representations of relief thereon, said relief comprising a manufactured shade with the values thereof proportional to the degree of actual slope appearing in the area represented in accordance with the method of claim 1.

6. A method for manufacturing a shade relief map comprises the steps of:

tracing from a topographic map contours of an area to be illustrated in shade relief;

drawing features, other than slope, of the area to be illustrated;

photographically producing from said drawing a copy for use in sharp focus image production;

photographically converting the contour tracing into shade density values by proportional shifting of the object and image focal distances to keep the print scale in registry with the sharp focus scale of said drawing;

superimposing the converted contour tracing image in registry with the sharp focus features drawing; and reproducing from the superimposed images a shade relief map with the value of the shade thereon proportional to the degree of slope existing in the area of study.

* * * * *